(12) United States Patent
Biskeborn et al.

(10) Patent No.: US 9,583,126 B1
(45) Date of Patent: Feb. 28, 2017

(54) DUAL-PATH FLEX CIRCUIT

(71) Applicant: International Business Machines Corporation, Armonk, NY (US)

(72) Inventors: Robert G. Biskeborn, Hollister, CA (US); Hoodin Hamidi, San Francisco, CA (US); David H. F. Harper, Vail, AZ (US); Sassan K. Shahidi, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/920,936

(22) Filed: Oct. 23, 2015

(51) Int. Cl.
| | |
|---|---|
| *G11B 5/55* | (2006.01) |
| *G11B 5/48* | (2006.01) |
| *G11B 33/12* | (2006.01) |
| *H05K 1/02* | (2006.01) |

(52) U.S. Cl.
CPC ............ *G11B 5/5504* (2013.01); *G11B 33/12* (2013.01); *H05K 1/028* (2013.01); *G11B 5/4893* (2013.01)

(58) Field of Classification Search
None
See application file for complete search history.

(56) References Cited

U.S. PATENT DOCUMENTS

| | | | |
|---|---|---|---|
| 5,331,493 A | | 7/1994 | Schwarz |
| 5,559,571 A | * | 9/1996 | Miyamoto ............... G03B 5/00 396/52 |
| 6,690,542 B1 | | 2/2004 | Wang |
| 6,972,931 B2 | | 12/2005 | Rudi et al. |
| 7,342,738 B1 | | 3/2008 | Anderson et al. |
| 8,009,377 B2 | | 8/2011 | Neumann |
| 8,054,579 B2 | | 11/2011 | Biskeborn |
| 2002/0186496 A1 | | 12/2002 | Saliba et al. |
| 2004/0085682 A1 | | 5/2004 | Jang et al. |
| 2005/0048809 A1 | * | 3/2005 | Bolen .................. H01R 12/592 439/67 |
| 2006/0098350 A1 | | 5/2006 | Hamidi |
| 2006/0181812 A1 | | 8/2006 | Kwon et al. |

(Continued)

FOREIGN PATENT DOCUMENTS

| | | |
|---|---|---|
| DE | 19847425 A1 | 8/1999 |
| WO | 9613833 A1 | 5/1996 |
| WO | 9617342 A1 | 6/1996 |

OTHER PUBLICATIONS

Biskeborn et al., Pending U.S. Appl No. 14/920,931, titled "Monolithic Tape Head and Actuator for High Density Recordig," filed on Oct. 23, 2015, pp. 1-33.

(Continued)

*Primary Examiner* — Craig A. Renner
(74) *Attorney, Agent, or Firm* — David Zwick (57) ABSTRACT

A flex circuit for connection to a moving device. The flex circuit includes a connections tab configured to present first and second pluralities of electrical conductors for electrically coupling to the moving device. First and second flex circuit paths extend from the connections tab and having separate distal ends, and include the first and second pluralities of electrical conductors, respectively. The first and second flex circuit paths are configured at their distal ends to present the first and second pluralities of electrical conductors, respectively, for electrical coupling to a circuit board.

6 Claims, 7 Drawing Sheets

(56) References Cited

U.S. PATENT DOCUMENTS

| | | | |
|---|---|---|---|
| 2008/0152286 A1* | 6/2008 | Ueno | H05K 1/0274 |
| | | | 385/101 |
| 2008/0186595 A1* | 8/2008 | Hasegawa | H05K 1/0256 |
| | | | 359/811 |
| 2008/0273278 A1 | 11/2008 | Iben | |
| 2009/0141389 A1 | 6/2009 | Saliba | |
| 2011/0094775 A1* | 4/2011 | Lin | H05K 1/118 |
| | | | 174/254 |
| 2013/0258519 A1 | 10/2013 | Poorman et al. | |
| 2013/0277095 A1* | 10/2013 | Lin | H05K 1/0277 |
| | | | 174/254 |
| 2014/0029135 A1 | 1/2014 | Koeppe | |
| 2014/0097021 A1* | 4/2014 | Su | H05K 9/00 |
| | | | 174/72 R |
| 2014/0144678 A1* | 5/2014 | Lin | H01R 12/592 |
| | | | 174/254 |
| 2014/0327983 A1 | 11/2014 | Biskeborn et al. | |
| 2014/0347766 A1 | 11/2014 | Biskeborn et al. | |

OTHER PUBLICATIONS

Biskeborn, Pending U.S. Appl. No. 14/920,931, titled "Magnetic Tape Appliance with Selectably Always-Leading Head Assemblies," filed on Oct. 23, 2015, pp. 1-30.

Zhong et al., "H2 Model Matching Feedforward Control for Tape Head Positioning Servo Systems", 2013 American Control Conference (ACC), Washington, DC, USA, Jun. 17-19, 2013, pp. 4504-4509, ©2013 AACC.

Soda, "Modeling Electrostatic Discharge Affecting GMR Heads," IEEE Transactions on Industry Applications, vol. 43, No. 5, Sep./Oct. 2007, Copyright 2007 IEEE, pp. 1144-1148.

\* cited by examiner

DUAL-PATH FLEX CIRCUIT

BACKGROUND

The present invention relates generally to flexible circuits configured for attachment to a moving device, and more particularly, to flexible circuits that provide two or more conductor trace paths with separate termini from localized connection points on the moving device.

The conventional method for flex circuit design for magnetic tape heads is one unitary flex cable per read and write head module, with a single connector at the distal end of the flex cable for connection to a circuit board. When an odd number of head modules are used in the head assembly, for example a three module head assembly configured as writer-reader-writer head modules, problems may occur with the conventional method if more flex cables are disposed on one side of the head actuator as compared to the other side. For example, using a conventional flex cable design with an odd number of head modules, having more flex cables disposed on one side of the head actuator as compared to the other side may create mechanical and electrical asymmetry issues with respect to unbalanced mechanical stress on the head actuator as the tape heads are moved.

A proposed solution may be to use two separate flex cables for one of the odd number of head modules. For example, to have one flex cable electrically connected to one half the channels of the head module be disposed on one side of the module, and another separate flex cable connected to the other half of the channels be disposed on the other side of the module. However, this proposed solution in fact adds complexity to the head module design due to the requirement to provide two flex cable bonding sites on the head module in a typically space-constrained area. As technology advances moved towards doubling or tripling of the number of channels per head, design complexities related to space requirements, cable and trace routing, cable flex bias, etc., will likely increase.

BRIEF SUMMARY

Embodiments of the present invention disclose a flex circuit for connection to a moving device. The flex circuit includes a connections tab configured to present first and second pluralities of electrical conductors for electrically coupling to the moving device. First and second flex circuit paths extend from the connections tab and having separate distal ends, and include the first and second pluralities of electrical conductors, respectively. The first and second flex circuit paths are configured at their distal ends to present the first and second pluralities of electrical conductors, respectively, for electrical coupling to a circuit board.

DETAILED DESCRIPTION

Embodiments of the invention are directed general to a flex circuit for connecting the channels of a tape head module to a circuit board. The flex circuit connects to the head module channels at a single wire bonding site. However, the flex circuit presents multiple paths from the head module for connection to the circuit board. In an exemplary embodiment, the flex circuit presents two paths from the tape head for channel connections to the circuit board, with approximately half of the channels connected to the board via one path, and the approximately other half the channels connected via the other path. The flex circuit is configured as a unitary circuit that includes two connectors, one each at opposing ends of the flex circuit, for connection to the circuit board, and a head module channels connection tab located on the flex circuit intermediate the opposing ends of the flex circuit. When configured for use, the flex circuit may include bends and rolling loops to reduce mechanical bias imparted by the flex circuit on the tape head as the tape head moves during normal operation.

Advantages of various embodiments of the invention may include a narrower cable width at the tape head due to each of the two paths only carrying approximately half of the required traces, less overall mechanical bias due to the two or more paths, less stress on the tape head due to a design directed to a balanced approach of the number of channels that are disposed on each side of the tape head assembly, and less inter-channel interference due to the reduced number of channel traces on the flex circuit paths that exit the tape head module.

Figure 1A:
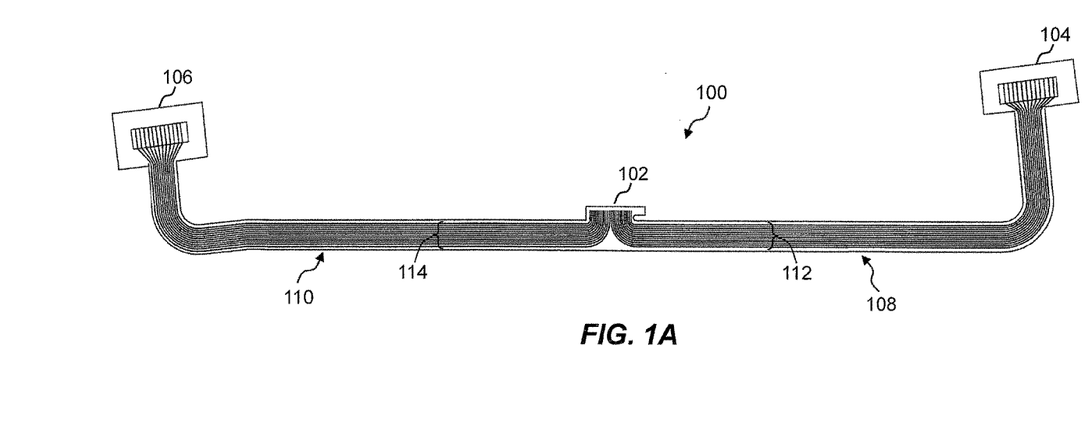
FIGS. 1A and 1B are plan views of a flex circuit, in accordance with an embodiment of the present invention.
Figure 1B:
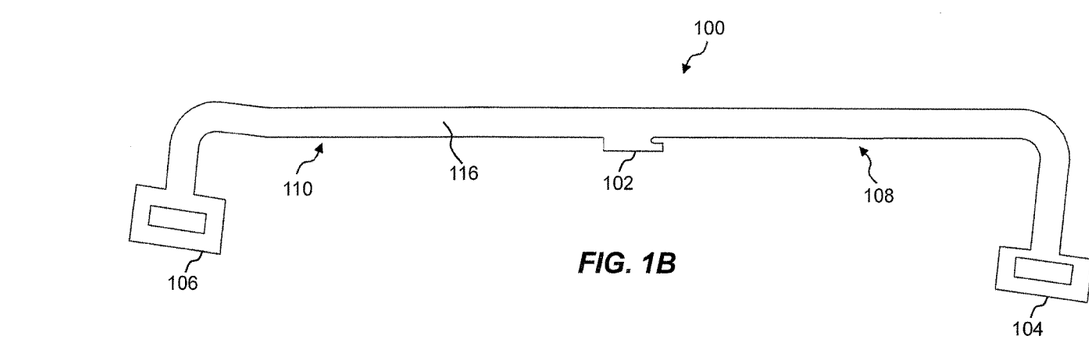

FIGS. 1A and 1B are plan views of both faces of a flex circuit 100, in accordance with an embodiment of the present invention. Flex circuit 100 includes head module channels connection tab 102, first circuit board connector 104 at the distal end of first flex circuit path 108, and second circuit board connector 106 at the distal end of second flex circuit path 110. First flex circuit path 108 further includes channel connector traces, or conductors, 112 that electrically couple head module channels connection tab 102 and first circuit board connector 104. In an exemplary embodiment, head module channels connection tab 102 is configured to allow wire bonding of channel connection traces that terminate on head module channels connection tab 102 to a channel traces of a tape head module. Second flex circuit path 110 further includes channel connector traces, or conductors, 114 that electrically couple head module channels connection tab 102 and second circuit board connector 106.

In an exemplary embodiment, head module channels connection tab 102 and channel connector traces 112 and 114 are configured such that each of channel connector traces 112 and 114 represent approximately half of the total number of channel connector traces of flex circuit 100. In certain embodiments, first flex circuit path 108 and second flex circuit path 110 may be constructed such that one or more characteristics of the two flex circuit paths are approximately symmetrical. For example, it may be desirable for the physical lengths of first flex circuit path 108 and second flex circuit path 110 to be approximately equal so that signal times along both paths is approximately equal. First flex circuit path 108 and second flex circuit path 110 may also be constructed such that certain mechanical characteristics of the two circuit paths a symmetric, as presented at head module channels connection tab 102. For example, flex circuit path 110 may be constructed such that first flex circuit path 108 and second flex circuit path 110 present approximately equal mechanical stresses at head module channels connection tab 102 when flex circuit 100 is in use in a tape appliance.

In an exemplary embodiment, each of first and second flex circuit paths 108/110 is approximately 4 mm wide. The length of the flex circuit mat be on the order of 10 cm, and have a thickness of about 150 um. Rolling loops in the flex circuit paths may have minimum diameters of about 1 cm.

In an exemplary embodiment, flex circuit 100 includes a flexible dielectric layer with an electrically conductive ground plane 116 disposed on or adjacent one face of the flexible dielectric, and channel connector traces 112 and 114 disposed on or adjacent the opposing face of the flexible dielectric. In one embodiment, the dielectric layer is liquid crystal polymer (LCP), and the ground plane 116 and channel connector traces 112 and 114 are formed of copper. Other embodiments may use, for example, a dielectric layer formed of polyimide. Those of skill in the art will recognize that in other embodiments, other combinations of materials may be used for the dielectric layer and the ground plane and channel connector traces, based on design requirements, which may include desired electrical and mechanical properties of the materials. It will also be recognized that flex circuit 100 may include layers in addition to the dielectric, ground plane, and channel connector trace layers, that may serve electrical, mechanical, or structural design requirements.

Figure 2:
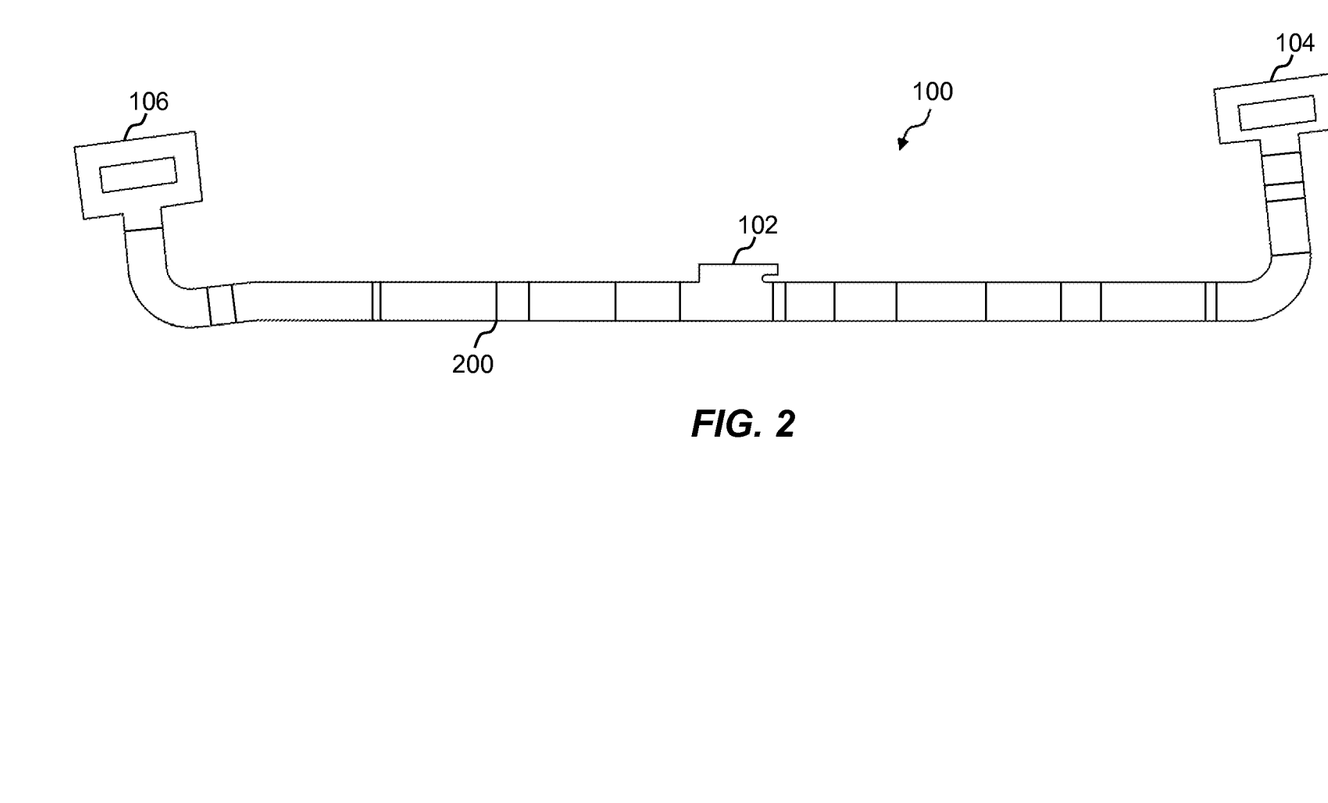
FIG. 2 is a plan view of a flex circuit, in accordance with an embodiment of the present invention.

FIG. 2 is a second plan view of the flex circuit 100, in accordance with an embodiment of the present invention. FIG. 2 shows pairs fold indicator lines 200 that indicate approximately where bends begin and end in flex circuit 100 when the flex circuit is in a neutral flex position, when the flex circuit is further configured for use in a tape appliance.

Figure 3:
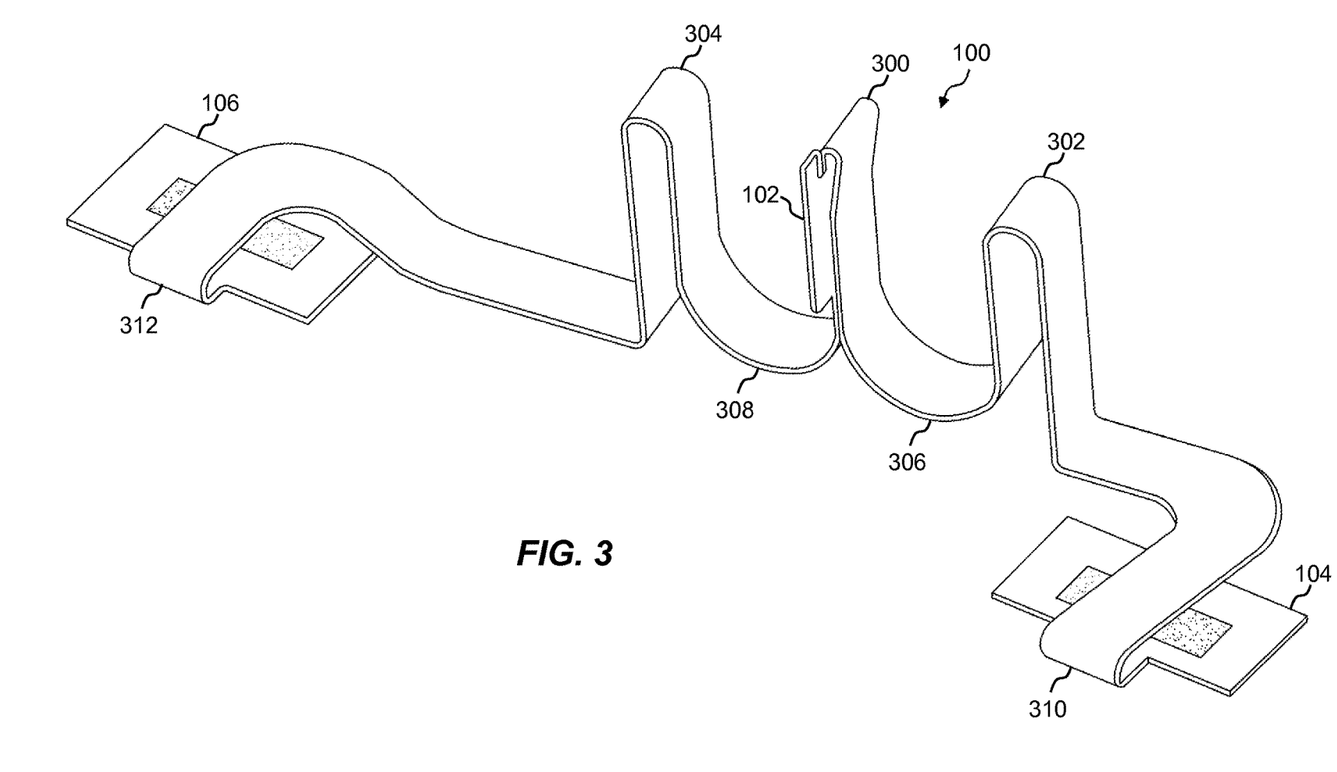
FIG. 3 is a perspective view of a folded flex circuit, in accordance with an embodiment of the present invention.

FIG. 3 is a perspective view of folded flex circuit 100, in accordance with an embodiment of the present invention. As illustrated, in an exemplary embodiment, when folded in accordance with fold indicator lines 200, flex circuit 100 includes first, second, and third uprights 300, 302, and 304. First rolling loop 306 is formed between, and results from, first and second uprights 300 and 302, and second rolling loop 308 is formed between, and results from, first and third uprights 300 and 304.

In the illustrated in the exemplary embodiment of FIG. 3, folded flex circuit 100 further includes bends 310 and 312, occurring at the distal ends of flex circuit 100 close to first and second circuit board connectors 104 and 106. In the illustrated embodiment, first and second circuit board connectors 104 and 106 are on portions of first and second flex circuit paths 108 and 110 that are approximately orthogonal to the portions of first and second flex circuit paths 108 and 110 that attach to head module channels connection tab 102.

In the illustrated embodiment, head module channels connection tab 102 presents the channel connector traces 112 and 114 in a lateral extension from the first and second flex circuit paths 108 and 110, and the flex circuit 100 further includes an upright formed by physically joining a portion of first flex circuit path 108 to a portion of second flex circuit path 110 such that a bend in the first flex circuit path is formed, in which the center of the bend is not located on any portion of the first flex circuit path 108 from which head module channels connection tab 102 extends, and the radius of the bend is a first predefined minimum radius.

In general, the particular topology of folded flex circuit 100 in various embodiments will be based upon various design factors including tape head module design, cable routing, circuit board layout, stress, strain, torque, and other mechanical forces presented at a tape head module attached to head module channels connection tab 102 as the tape head module moves during normal operation, electrical characteristics of the tape head and flex cable, EMI, channel crosstalk, cost, aesthetics, etc.

As illustrated, the various loops and bends in folded flex circuit 100 have associated radii of curvature. In certain embodiments, it may be desirable to configure the loops and bends such that those having radii of curvature less than a certain minimum value have their inner radii on the face of flex circuit 100 that includes the ground plane layer 116. This may act to lessen the impact of the stress and strain to the ground plane layer 116 and the channel connector traces 112/114 resulting from the bends because the channel connector trace layer will experience a compressive stress and the ground plane layer 116 will experience a tensile stress. For example, the impact of small failures in the ground plane layer 116 resulting from the tensile stress of sharp bends in flex circuit 100 will likely be less than the impact of small failures in the channel connector traces 112/114 resulting from the tensile stress of the sharp bends.

Figure 4:
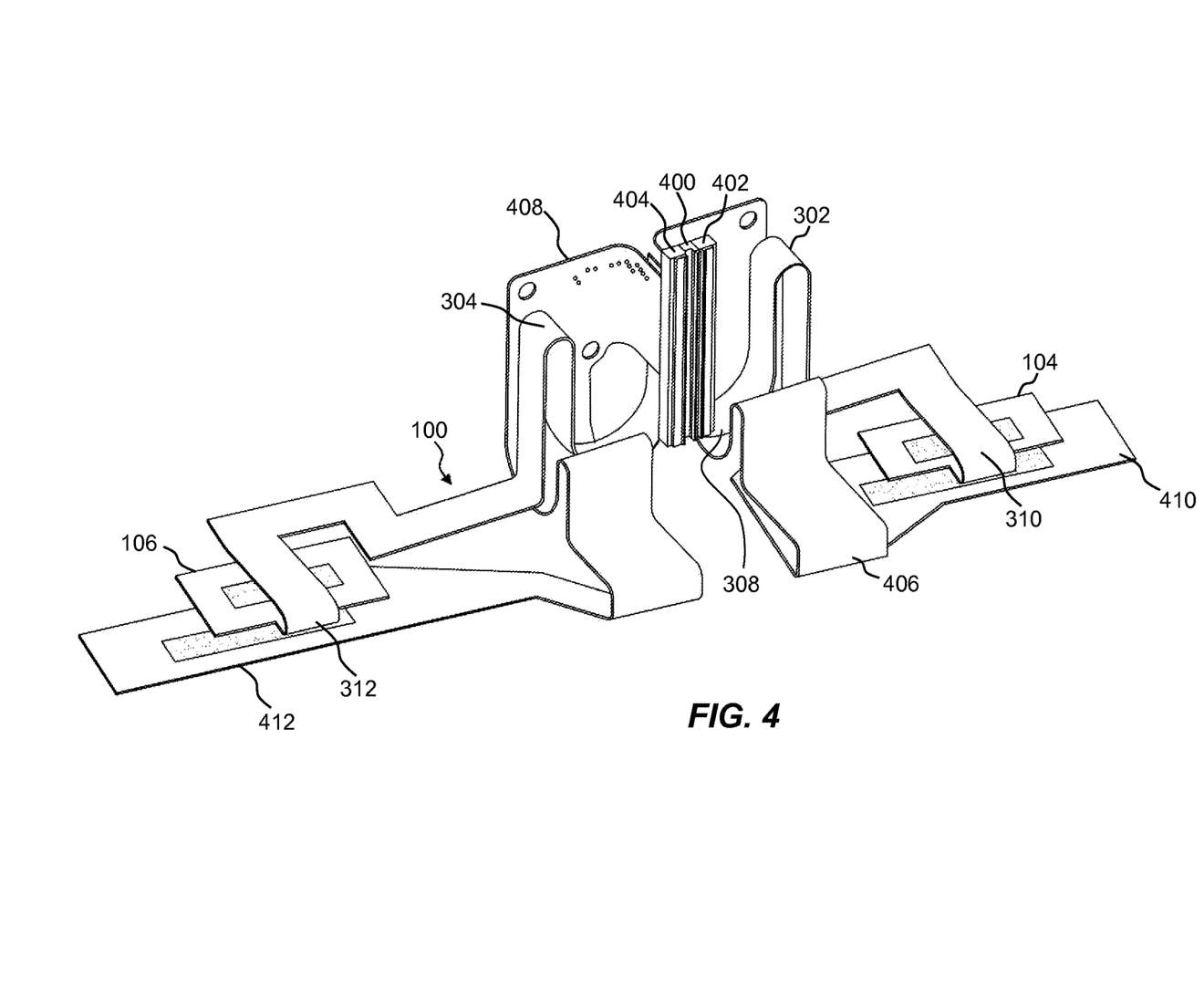
FIG. 4 is a perspective view of a folded flex circuit coupled to a tape head assembly, in accordance with an embodiment of the present invention.

FIG. 4 is a perspective view of folded flex circuit 100 coupled to a tape head assembly, in accordance with an embodiment of the present invention. The tape head assembly, which includes read head 400 and write heads 402 and 404, is arranged in a write-read-write configuration. Each tape head includes either read or write elements (not shown), one channel per element, with the number of such elements determined in part by the number of data tracks per data band on the tape. For example, the number of channels may be 16, 32, 64, etc. In certain embodiments, there may be additional channels, for example, for servo tracking heads, or for one or more read or write elements in the tape heads. The number of individual channel traces in channel connector traces 112/114, and in flex circuits 406 and 408, is determined by the number of channels for the tape heads 400, 402, and 404.

Flex circuit 406 allows for attachment of write head 404 to a circuit board via circuit board connector 410. Similarly, flex circuit 408 allows for attachment of write head 404 to a circuit board via circuit board connector 412. Flex circuits 406 and 408 may include various bends, rolling loops, and other stress relief features designed, among other considerations, to manage the mechanical bias imparted by these flex circuits on the tape head assembly by the flex circuits as the tape head assembly moves during normal operation. Each of flex circuits 406 and 408, although illustrated more clearly with respect to flex circuit 408, are arranged in a single path configuration such that the flex circuits connect to all channels of the write heads 406 and 408, respectively, to circuit board connectors 410 and 412 via single paths that include all channel connector traces.

In contrast, flex circuit 100, connected to read head 400 via head module channels connection tab 102 (hidden in this view), connects the channels of read head 400 to circuit board connectors 104 and 106 via two separate paths—one path exiting the head assembly to one side, and the other path exiting the head assembly to the other side. As illustrated, this arrangement may allow for easier balancing and management of the biases imparted on the tape head assembly in one or more dimensions by the flex cables 100, 406, and 408 as the tape head assembly moves in normal operation. Further, because circuit board connectors 104 and 106 of flex circuit 100 connect approximately half the number of channel traces to a circuit board as connectors 410 and 412, it may be easier to locate the connection or bonding sites for connectors 104/106 on a circuit board with space constraints. For example, as indicated, the bonding sites for connectors 104/106 may be located on the top of a circuit board, thus allowing for shorted flex circuit path lengths.

Figure 5:
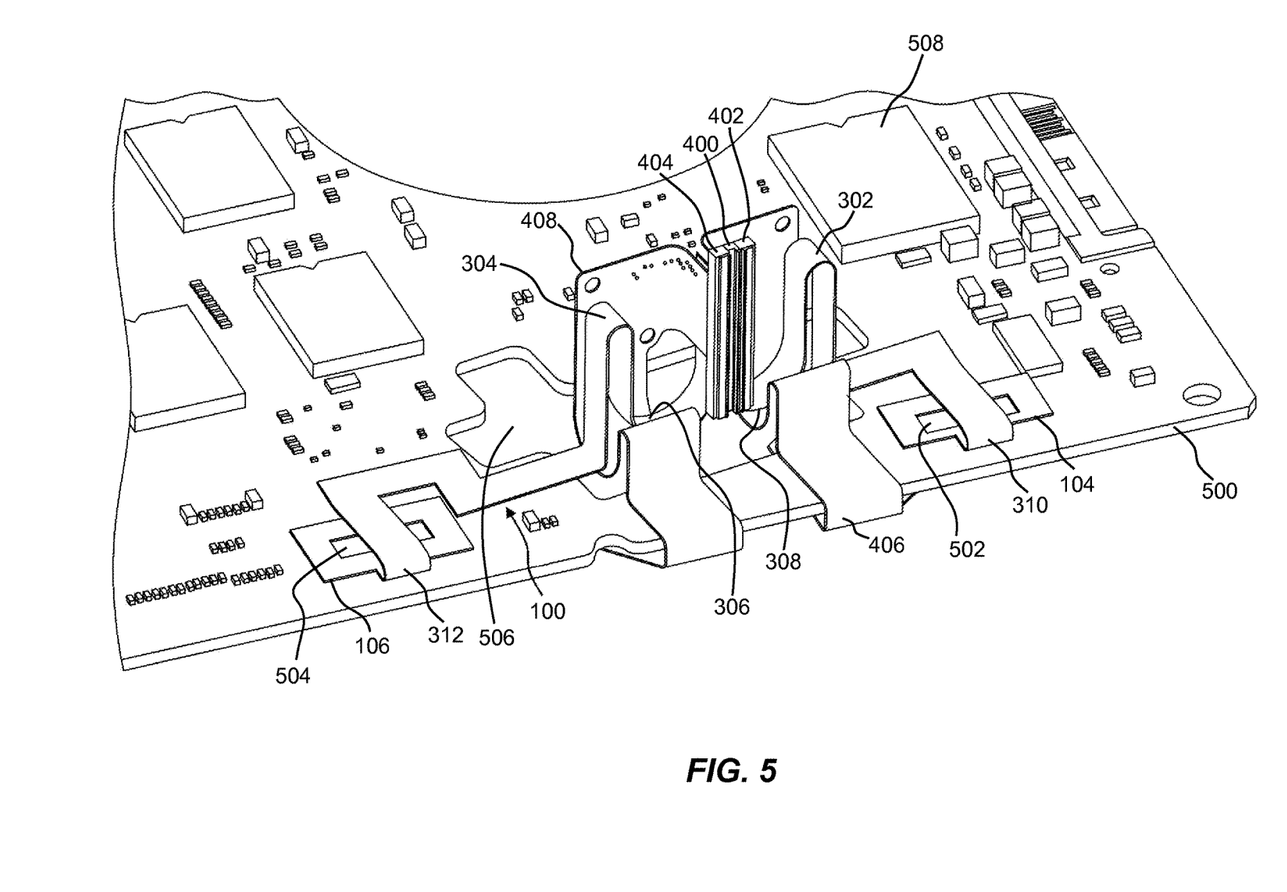
FIG. 5 is a perspective view of a folded flex circuit coupled to a tape head assembly on a circuit board, in accordance with an embodiment of the present invention.

FIG. 5 is a perspective view of folded flex circuit 100 coupled to tape head assembly 400/402/404 on a circuit board 500, in accordance with an embodiment of the present invention. Circuit board 500 includes various circuitry components, such as component 508. Circuit board 500 further includes a cut-out 506 for a tape head actuator, not shown, to attach to the tape head assembly 400/402/404. Circuit board connectors 104/106 of flex circuit 100 connect to circuit board 500 at bonding sites 502 and 504, respectively.

Figure 6:
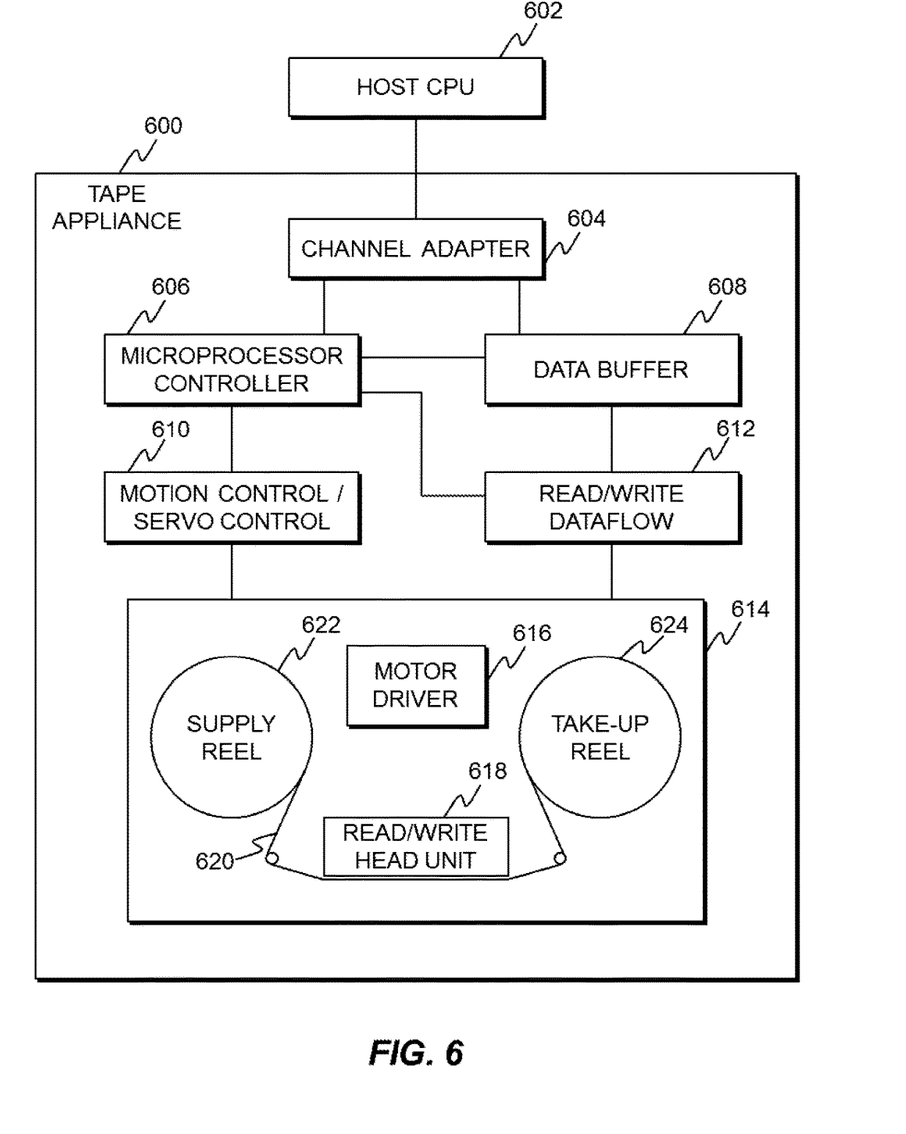
FIG. 6 is a functional block diagram illustrating a tape recording appliance, in accordance with an embodiment of the present invention.

FIG. 6 is a functional block diagram of a tape appliance 600, in accordance with an embodiment of the invention. In an exemplary embodiment, tape appliance 600 includes circuit 500, including flex circuit 100. Tape appliance 600 may include several components providing a control and data transfer system for reading and writing data from a host CPU 602, an embodiment of which is described below in relation to FIG. 7, to a magnetic tape medium. Tape appliance 600 may include a channel adapter 604, a computer, such as microprocessor controller 606, a data buffer 608, a read/write data flow circuit 612, a motion control system 610, and a tape interface system 614 that includes a motor driver circuit 616 and read/write head unit 618.

Microprocessor controller 606 may provide overall control functionality for the operations of all other components of tape appliance 600. The functions performed by microprocessor controller 606 may be programmable via microcode routines (not shown) according to desired tape drive operational characteristics. During data write operations (with all dataflow being reversed for data read operations), microprocessor controller 606 activates channel adapter 604 to perform the required host interface protocol for receiving an information data block. Channel adapter 604 communicates the data block to the data buffer 608 that stores the data for subsequent read/write processing. Data buffer 608 in turn communicates the data block received from channel adapter 604 to read/write dataflow circuitry 612, which formats the device data into physically formatted data that may be recorded on a magnetic tape medium. Read/write dataflow circuitry 612 is responsible for executing all read/write data transfer operations under the control of microprocessor controller 606. Formatted physical data from read/write circuitry 612 is communicated to tape interface system 614. The latter includes one or more read/write modules, for example, modules that include read and write heads 400/402/404, in read/write head unit 618, and drive motor components (not shown) for performing forward and reverse movement of a tape medium 620 mounted on a supply reel 622 and a take-up reel 624. The drive components of tape interface system 614 are controlled by motion control system 610 and motor driver circuit 616 to execute such tape movements as forward and reverse recording and playback, rewind and other tape motion functions. In addition, in multi-track tape drive systems, motion control system 610 transversely positions read/write heads in read/write head unit 618 relative to the direction of longitudinal tape movement in order to record data in a plurality of tracks. Tape interface system 614 may include, for example, circuit board 500, and the components thereon, as illustrated in FIG. 5.

In various embodiments, during read operations, microprocessor controller 606 may receive the unformatted electrical signals from tape interface system 614, either directly or via read/write dataflow circuitry 612. In other embodiments, read/write dataflow circuitry 612 may perform various pre-processing functions on the electrical signals from tape interface system 614, and transmit information that is representative of the electrical signals to microprocessor controller 606. In these embodiments, microprocessor controller 606 may include appropriate electrical circuitry, logic, firmware, software, etc., to perform analysis of the electrical signals or information to determine various characteristics of the signals related to quality of the recorded data and the magnetic medium, in accordance with embodiments of the invention. In general, the appropriate electrical circuitry, logic, firmware, software, etc., to perform analysis of the electrical signals to determine various characteristics of the signals related to quality of the recorded data and the magnetic medium may be located in one or more functional components of a tape appliance, such as tape appliance 600, and/or in a host computer, such as host CPU 602.

Figure 7:
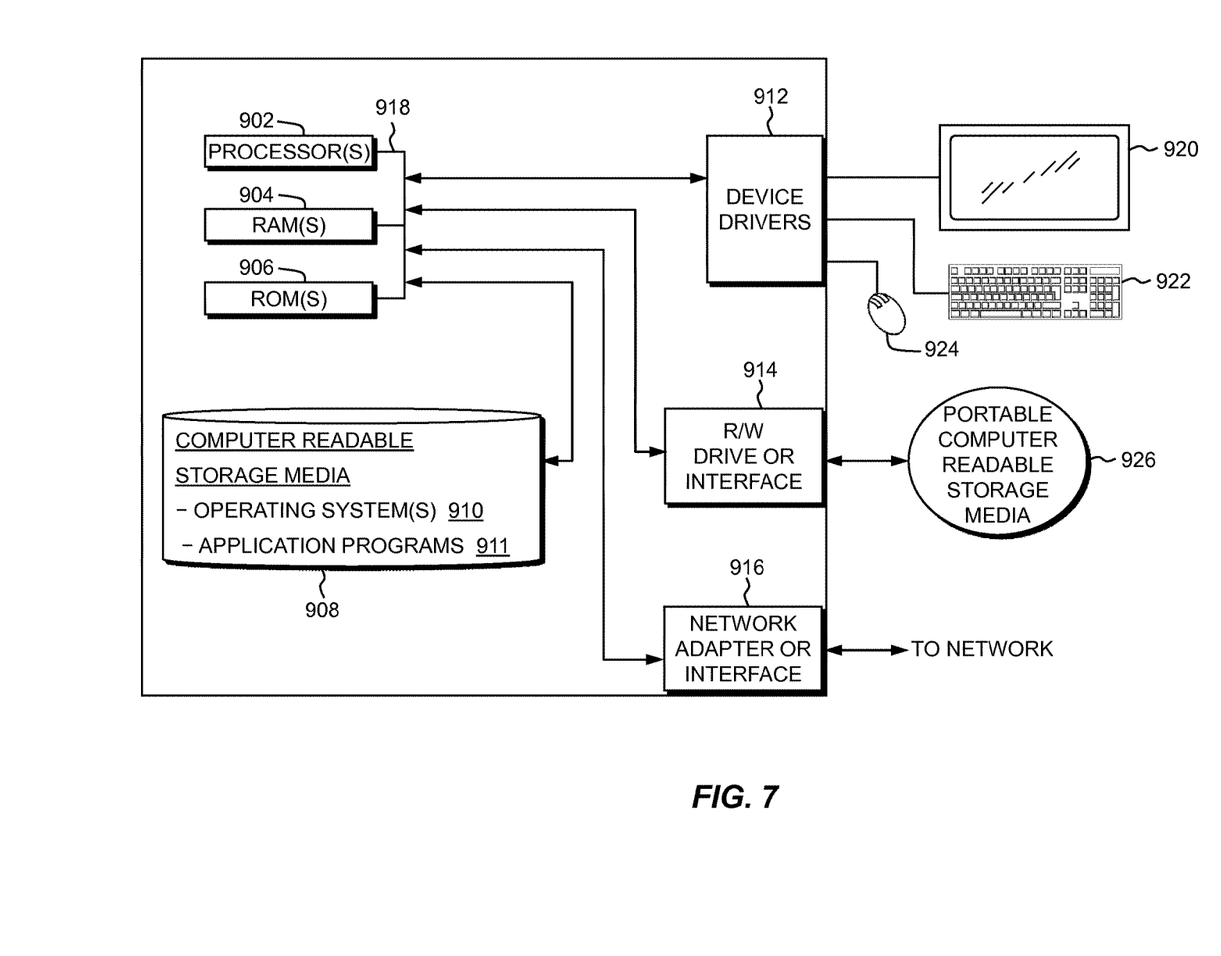
FIG. 7 depicts a block diagram of components of computing device 606 of FIG. 6, in accordance with an embodiment of the present invention.

FIG. 7 depicts a block diagram of components of host CPU 602, in accordance with an embodiment of the present invention. It should be appreciated that FIG. 7 provides only an illustration of one implementation and does not imply any limitations with regard to the environments in which different embodiments may be implemented. Many modifications to the depicted environment may be made.

Host CPU 602 can include one or more processors 902, one or more computer-readable RAMs 904, one or more computer-readable ROMs 906, one or more computer-readable storage media 908, device drivers 912, read/write drive or interface 914, network adapter or interface 916, all interconnected over a communications fabric 918. Communications fabric 918 can be implemented with any architecture designed for passing data and/or control information between processors (such as microprocessors, communications and network processors, etc.), system memory, peripheral devices, and any other hardware components within a system.

One or more operating systems 910 and application program(s) 911 are stored on one or more of the computer-readable storage media 908 for execution by one or more of the processors 902 via one or more of the respective RAMs 904 (which typically include cache memory). In the illustrated embodiment, each of the computer-readable storage media 908 can be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

Host CPU 602 can also include a R/W drive or interface 914 to read from and write to one or more portable computer-readable storage media 926. Application program(s) 911 on host CPU 602 can be stored on one or more of the portable computer-readable storage media 926, read via the respective R/W drive or interface 914 and loaded into the respective computer-readable storage media 908.

Host CPU 602 can also include a network adapter or interface 916, such as a TCP/IP adapter card or wireless communication adapter (such as a 4G wireless communication adapter using OFDMA technology). Application program(s) on host CPU 602 can be downloaded to the computing device from an external computer or external storage device via a network (for example, the Internet, a local area network or other, wide area network or wireless network)

and network adapter or interface 916. From the network adapter or interface 916, the programs are loaded into the computer-readable storage media 908. The network may comprise copper wires, optical fibers, wireless transmission, routers, firewalls, switches, gateway computers and/or edge servers.

Host CPU 602 can also include a display screen 920, a keyboard or keypad 922, and a computer mouse or touchpad 924. Device drivers 912 interface to display screen 920 for imaging, to keyboard or keypad 922, to computer mouse or touchpad 924, and/or to display screen 920 for pressure sensing of alphanumeric character entry and user selections. The device drivers 912, R/W drive or interface 914 and network adapter or interface 916 can comprise hardware and software (stored in computer-readable tangible storage device 908 and/or ROM 906).

Based on the foregoing, a computer system, method, and computer program product have been disclosed. However, numerous modifications and substitutions can be made without deviating from the scope of the present invention. Therefore, the present invention has been disclosed by way of example and not limitation.

What is claimed is:

1. A tape appliance, comprising:
   a tape head assembly that includes a center tape head module and an equal number of one or more outside tape head modules on each side of the center tape head module, wherein each tape head module includes a plurality of read and/or write elements for reading and/or writing a number of data tracks to a magnetic tape;
   a unitary flex circuit for each of the outside tape head modules for electrically connecting the read and/or write elements of each of the outside tape head modules to a circuit board;
   a dual-path flex circuit for connecting the center tape head module to the circuit board, the dual-path flex circuit comprising:
      a connections tab configured to present first and second pluralities of electrical conductors for electrically coupling to the read and/or write elements of the center tape head module;
      first and second flex circuit paths extending from the connections tab and having separate distal ends, wherein the first and second flex circuit paths include the first and second pluralities of electrical conductors, respectively;
      the first and second flex circuit paths configured at their distal ends to present the first and second pluralities of electrical conductors, respectively, for electrical coupling to a circuit board.

2. A tape appliance in accordance with claim 1, wherein the first and second flex circuit paths are formed of a flexible dielectric having an electrically conductive ground layer disposed on one face of the dielectric, and the first and second pluralities of electrical conductors disposed on the opposing face of the flexible dielectric.

3. A tape appliance in accordance with claim 1, wherein the quantities of electrical conductors in each of the first and second pluralities of electrical conductors are approximately the same.

4. A tape appliance in accordance with claim 1, wherein the dual-path flex circuit further comprises stress relief features for reducing overall stress on the center tape head module, to a predefined range, and balancing the stresses on the center tape head module in one or more dimensions to within a predefined range, wherein the stresses result from mechanical bias imparted by the dual-path flex circuit on the center tape head module as the center tape head module moves during normal operation.

5. A tape appliance in accordance with claim 4, wherein the stress relief features include one or more of bends and rolling loops in the dual-path flex circuit.

6. A tape appliance in accordance with claim 1, wherein the connections tab presents the first and second pluralities of electrical conductors in a lateral extension from the first and second flex circuit paths, and the dual-path flex circuit further comprises an upright formed by physically joining a portion of the first flex circuit path to a portion of the second flex circuit path whereby a bend in the first flex circuit path is formed, wherein the center of the bend is not located on any portion of the first flex circuit path from which the connections tab segment extends, and wherein the radius of the bend is a first predefined minimum radius.

* * * * *